(12) United States Patent
Richardson et al.

(10) Patent No.: US 10,768,204 B2
(45) Date of Patent: *Sep. 8, 2020

(54) ELECTRICAL MEASUREMENT DEVICES FOR A DEVICE UNDER TEST

(71) Applicant: Illinois Tool Works Inc., Glenview, IL (US)

(72) Inventors: Jeffrey Richardson, Glenview, IL (US); Adam Willwerth, North Yarmouth, ME (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/291,587

(22) Filed: Mar. 4, 2019

(65) Prior Publication Data

US 2019/0195912 A1   Jun. 27, 2019

Related U.S. Application Data

(63) Continuation of application No. 15/335,546, filed on Oct. 27, 2016, now Pat. No. 10,222,399.

(Continued)

(51) Int. Cl.
*G01R 1/067* (2006.01)
*G01R 31/34* (2020.01)
(Continued)

(52) U.S. Cl.
CPC ..... *G01R 1/06755* (2013.01); *G01R 1/06705* (2013.01); *G01R 31/343* (2013.01);
(Continued)

(58) Field of Classification Search
CPC ............ G01R 1/06705; G01R 1/06738; G01R 1/06755; G01R 1/06788; G01R 31/343;
(Continued)

(56) References Cited

U.S. PATENT DOCUMENTS 3,812,351 A * 5/1974 Coberley ........... B65H 23/1882
250/231.13
3,980,914 A   9/1976 Cunningham
(Continued)

FOREIGN PATENT DOCUMENTS

| CN | 201340433 | 11/2009 |
|---|---|---|
| CN | 101636120 | 1/2010 |
| CN | 202308506 | 7/2012 |

OTHER PUBLICATIONS

AEGIS-05C-9100_datasheet.
(Continued)

*Primary Examiner* — Vinh P Nguyen
(74) *Attorney, Agent, or Firm* — McAndrews, Held & Malloy, Ltd.

(57) ABSTRACT

Methods and apparatus for electrical measurement are disclosed. An example electrical measurement device includes a conductive cable comprising a plurality of conductive filaments on a first end and an electrical connector on a second end, a cable mount that includes a base and an adjustable support attached to the base and the conductive cable to hold the plurality of conductive filaments in contact with a rotating element of a device under test during a measurement operation, with the conductive cable forming a portion of a circuit when the plurality of conductive filaments are in contact with the rotating element of the device under test and the electrical connector is in contact with an output.

20 Claims, 5 Drawing Sheets

Related U.S. Application Data

(60) Provisional application No. 62/248,067, filed on Oct. 29, 2015.

(51) Int. Cl.
*H01R 11/24* (2006.01)
*H01R 39/24* (2006.01)

(52) U.S. Cl.
CPC ...... *G01R 1/06738* (2013.01); *G01R 1/06788* (2013.01); *H01R 11/24* (2013.01); *H01R 39/24* (2013.01); *H01R 2201/20* (2013.01)

(58) Field of Classification Search
CPC .......................... G01R 33/0354; H01R 11/24; H01R 2201/20; H01R 39/24; H02K 3/02; H02K 55/00; H02K 15/02; H02K 15/12; H02K 16/02; H02K 1/02; H02K 31/00; H02K 3/04; H02K 3/24; H02K 3/32; H02K 3/47; H02K 3/527; H02K 49/12; H02K 51/00; H02K 55/02; H02K 55/04; H02K 7/02; H02K 7/09; H02K 9/20; H02K 29/08; H02K 11/33; H02K 1/12; H02K 29/12; H02K 33/00; H02K 33/16; H02P 1/28; H02P 6/17

See application file for complete search history.

(56) References Cited

U.S. PATENT DOCUMENTS

| | | | |
|---|---|---|---|
| 4,519,669 A | 5/1985 | Archibald | |
| 6,628,036 B1 | 9/2003 | Lynch | |
| 6,979,976 B2 * | 12/2005 | Tachibana | H02P 6/24 |
| | | | 318/269 |
| 7,557,485 B1 | 7/2009 | Lynch | |
| 7,622,844 B1 | 11/2009 | Kuhlmann-Wilsdorf | |

OTHER PUBLICATIONS

SVP Styles_Jan. 2016.
Notification of Transmittal of the International Search Report and the Written Opinion of the International Searching Authority, or the Declaration; PCT/US2016/059269; dated Feb. 16, 2016; 10 pages.
"Measuring for Voltage on Shaft of Generator", Apr. 10, 2012, pp. 1-2 of "https://www.docin.com/p-379716738.html".

* cited by examiner

ELECTRICAL MEASUREMENT DEVICES FOR A DEVICE UNDER TEST

RELATED APPLICATIONS

This application claims priority to U.S. patent application Ser. No. 15/335,546, filed Oct. 27, 2016, and titled "Electrical Measurement Devices," which claims priority to U.S. Provisional Patent Application Ser. No. 62/248,067, filed Oct. 29, 2015. The entirety of U.S. patent application Ser. No. 15/335,546 and U.S. Provisional Patent Application Ser. No. 62/248,067 are incorporated herein by reference.

BACKGROUND

This disclosure relates generally to electrical measurement and, more particularly, to electrical measurement devices.

Conventional methods of measuring electrical properties of motors, such as output current and/or voltage, involve close proximity of human operators to moving machinery.

BRIEF SUMMARY

Electrical measurement devices are disclosed, substantially as shown in and/or described in connection with at least one of the figures, as set forth more completely in the claims.

Advantages, aspects and novel features of the present invention, as well as details of an illustrated embodiment thereof, will be more fully understood from the following description and drawings.

DETAILED DESCRIPTION

Embodiments of the present disclosure will be described with respect to electrical measurement devices for measuring an electrical property of a device under test.

An example electrical measurement device includes a conductive cable having a plurality of conductive filaments at a distal end and an electrical connector at a proximal end. The conductive cable is secured by a cable mount to maintain the electrical measurement device at a fixed position during a measurement operation. In an example, the conductive filaments are flexible and bound by a coupling to take the form of a brush. Further, in some examples, the conductive filaments may be packed into bundles, such as a carpet of grown fibers, or a bundle of spun fibers. The cable mount can be arranged to hold the brush of conductive filaments so as to maintain contact with a rotating member of the device under test, such as a rotating shaft of a motor.

In this manner, a user can set up the electrical measurement device with the brush making electrical contact with rotating member of the device under test, securely mounted by the cable mount, and be a safe distance from the rotating shaft during the measurement operation. The cable mount can be secured by a lock, such as a magnetic switch in contact with a ferromagnetic surface. During the measurement operation, the electrical connector can be output to one or more sensors, such as a voltmeter or ammeter, to measure an electrical property of the device under test. Thus, advantageously, a measurement operation can be conducted on a high speed rotating shaft of a motor while the user is a safe distance from moving parts. Further, the user need not come into contact with potentially harmful conductive elements.

Figure 1:
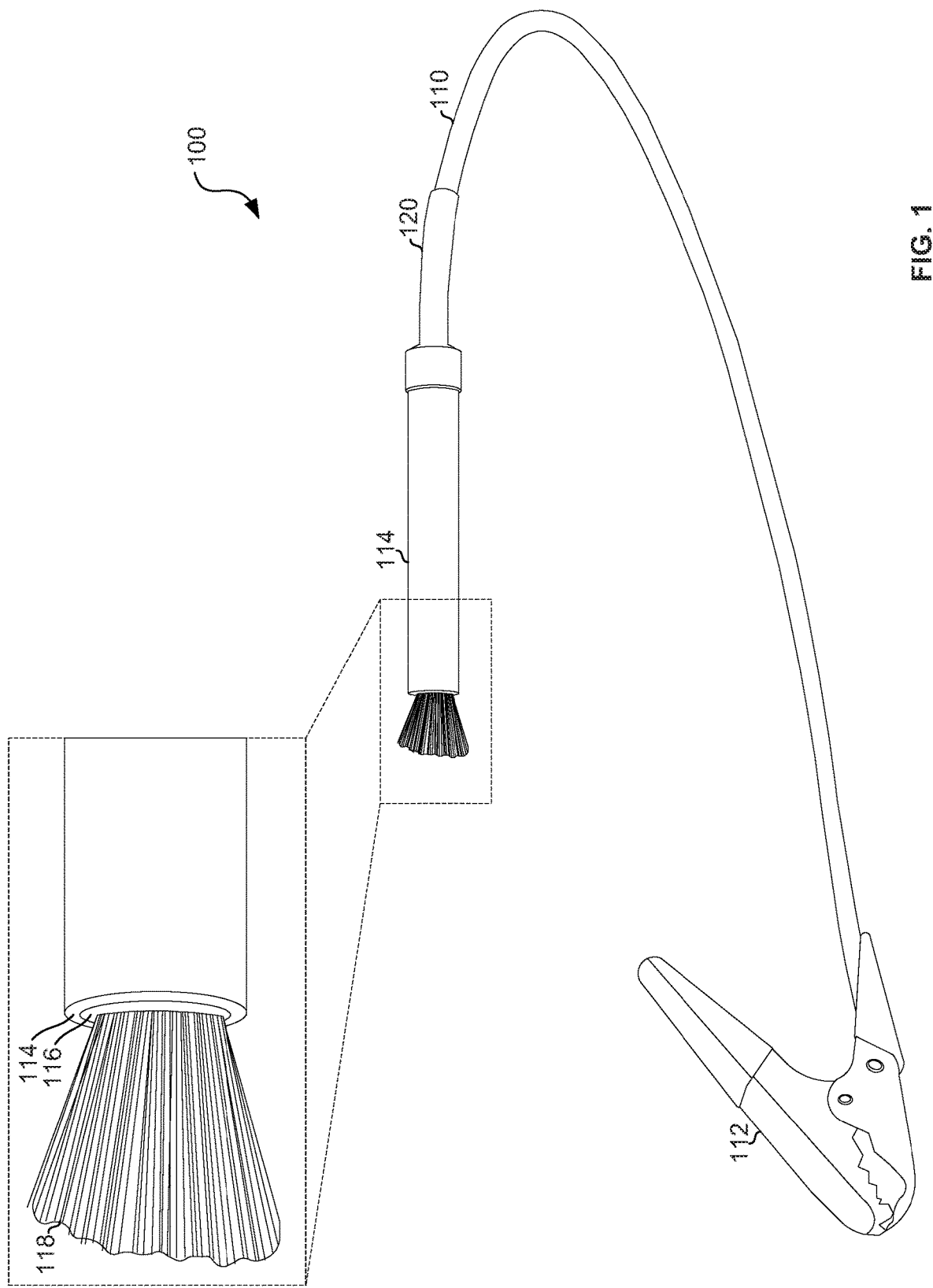
FIG. 1 shows an example electrical measurement device in accordance with aspects of this disclosure.

FIG. 1 shows an example electrical measurement device 100. The device 100 includes a bundle of conductive filaments 118 attached to a coupling 116, and a high current capacity conductive cable 110. The coupling 116 is protected by nonconductive holder material 114. The conductive cable 110 is protected by a nonconductive sheathing 120 and may have a clamp 112, or other connector, at the other end for making electrical connections.

In the example implementation of FIG. 1, the conductive filaments 118 are flexible so as to maintain electrical contact with a device under test, even when the device under test is moving (e.g., rotating). The conductive filaments 118 may be constructed from a conductive or semi-conductive material, depending upon implementation-specific designs and requirements. For example, the conductive filaments 118 may be constructed from silicon-containing materials such as silicon fibers or silicon nanotubes, carbon materials such as carbon fibers, carbon nanotubes, or graphene materials, or conductive polymers such as conductive synthetic polymers and conductive natural polymers, metal coated fibers, and so forth. Further, the filaments 118 may be nanofibers, microfibers, or larger. In some embodiments, the diameters of the individual filaments 118 may be of a size suitable for inducing ionization at the ends (i.e., tips) of the filaments 118. In one example, a suitable size may be smaller than approximately 500 microns. That is, the filaments 118 may have diameters ranging anywhere from approximately 2, 10, 20, 200, 400, 600, or 800 nanometers (nm) to approximately 1, 2, 5, 10, 100, 200, 300, 400, or 500 microns and above. For example, the conductive filaments 118 may have diameters between approximately 1 and 150, 2 and 145, 10 and 140, 20 and 130, 30 and 120, 40 and 110, 50 and 100, 60 and 90, 70 and 80, or about 75 microns.

The coupling 116 provides structural rigidity for maintaining the position of the flexible conductive filaments 118 while in contact with the device under test. The conductive filaments 118 may be present as single bundles, or may be in multiple bundles (e.g., as a brush). In some examples, the conductive filaments may be present as continuous rows, discontinuous patches, bundles, broken rings, semi-circles, and so forth. In an example implementation, the coupling 116 securing the conductive filaments 118 is made of a conductive material, such as copper. Any other conductive material may be used.

The nonconductive holder material 114 enables a person and/or an apparatus to hold the device 100 while the device 100 is in use without being subjected to the current flowing through the conductive filaments 118 and/or the voltage present on the conductive filaments 118. Further, the device 100 can be treated with one or more insulative layers to protect people and equipment. Thus, during a measurement operation, the conductive filaments 118 and connector 112 may be the only conductive elements exposed.

Figure 2:
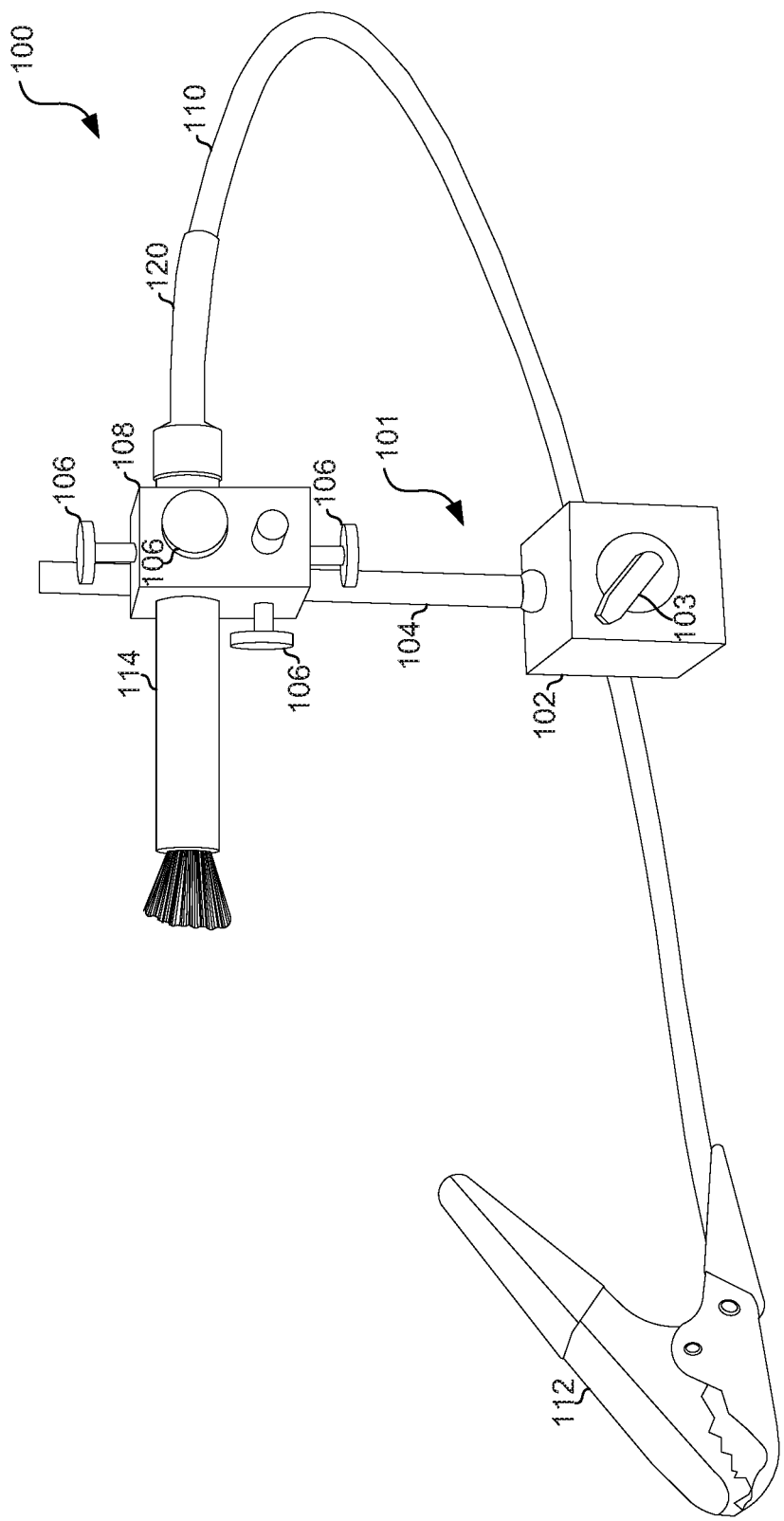
FIG. 2 shows another example measurement device in accordance with aspects of this disclosure.

FIG. 2 shows an example implementation in which the device 100 is held by a mount 101 that includes a base 102, an adjustable vertical support 104, and a housing 108. In the example of FIG. 2, the base 102 includes a magnetic lock 103, but the lock 103 can be any mechanism suitable for securing the mount 101 in a fixed position during a measurement operation (e.g., a clamp, an immovable support, etc.). The vertical support 104 can raise or lower the conductive cable 110 to adjust the height relative to the base 102. The housing 108 allows the position of the conductive cable 110 to be adjusted along one or more axes. Adjustment may include, for example, loosening one or more of the knobs 106, adjusting the position of the housing 108 relative to the vertical support 104, and then re-tightening the knobs 106. Similarly, the device 100 may be adjustable within the housing 108. For example, the distance the device 100 extends from the housing 108 may be adjustable by loosening a knob 106, adjusting the length of the conductive cable 110 that extends from the housing 108, and then re-tightening the knob 106.

In the example of FIG. 2, the magnetic lock 103 on the base 102 includes a switch for turning on and off the magnetic lock. Thus enabling repositioning of the holder apparatus into any desirable location and orientation where there is a ferromagnetic material to which it can be attached. Similarly, additional or alternative locking devices may be used based on the test environment. As an example, if no ferromagnetic material is in the operational area, a stand or transportable structure can be employed to ensure a fixed position at which the device is held to maintain conductive contact between the conductive filaments 118 and the device under test.

Figure 3:
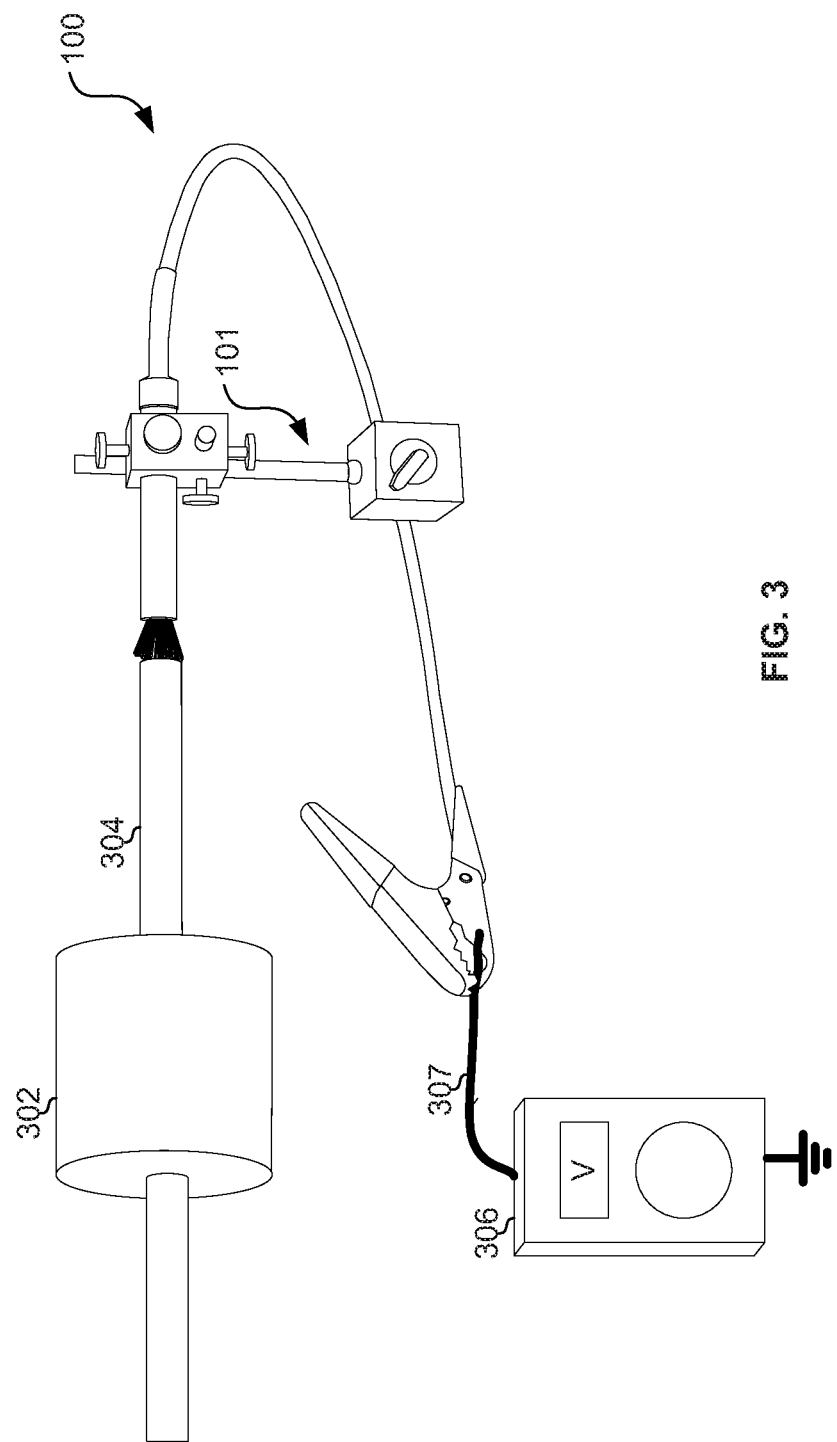
FIG. 3 shows an example of using the measurement device of FIG. 1 to measure voltage on a motor shaft.

FIG. 3 shows the measurement device of FIG. 1 measuring voltage on a motor shaft while the motor is in operation. Testing a motor 302 may require measuring the voltage on the motor's shaft 304 while the motor 302 is operating (i.e., while the shaft 304 is spinning). The device 100 improves the safety of measuring rotating devices because the device 100 allows people performing the test to remain a safe distance away from the device under test while the conductive filaments 118 maintain solid electrical contact with the shaft 304. For measuring the voltage, the clamp 112 is connected to one lead of a voltmeter 306 while the other lead is connected to ground.

Figure 4:
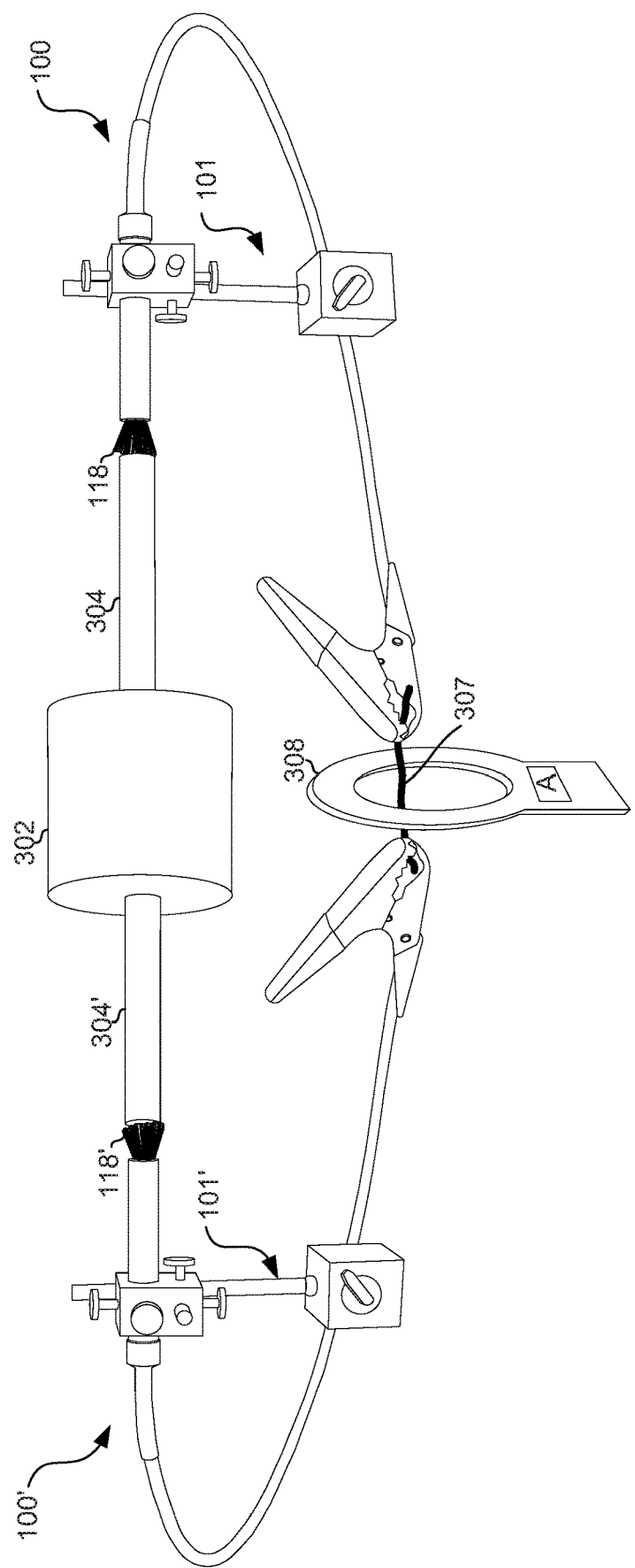
FIG. 4 shows an example of using the measurement device of FIG. 1 to measure current through a motor shaft.

FIG. 4 shows measurement of motor current using two instances of the measurement device described herein. The conductive filaments 118 of the first device 100 contact one end of the shaft 304. The conductive filaments 118' of the second device 100' contact other end of the shaft 304'. In the example shown in FIG. 4, the connectors of the first and second devices are each in electrical contact with a conductive element 307. An electrical sensor, such as ammeter 308, is employed to test an electrical property of the motor 302, such as current.

Figure 5:
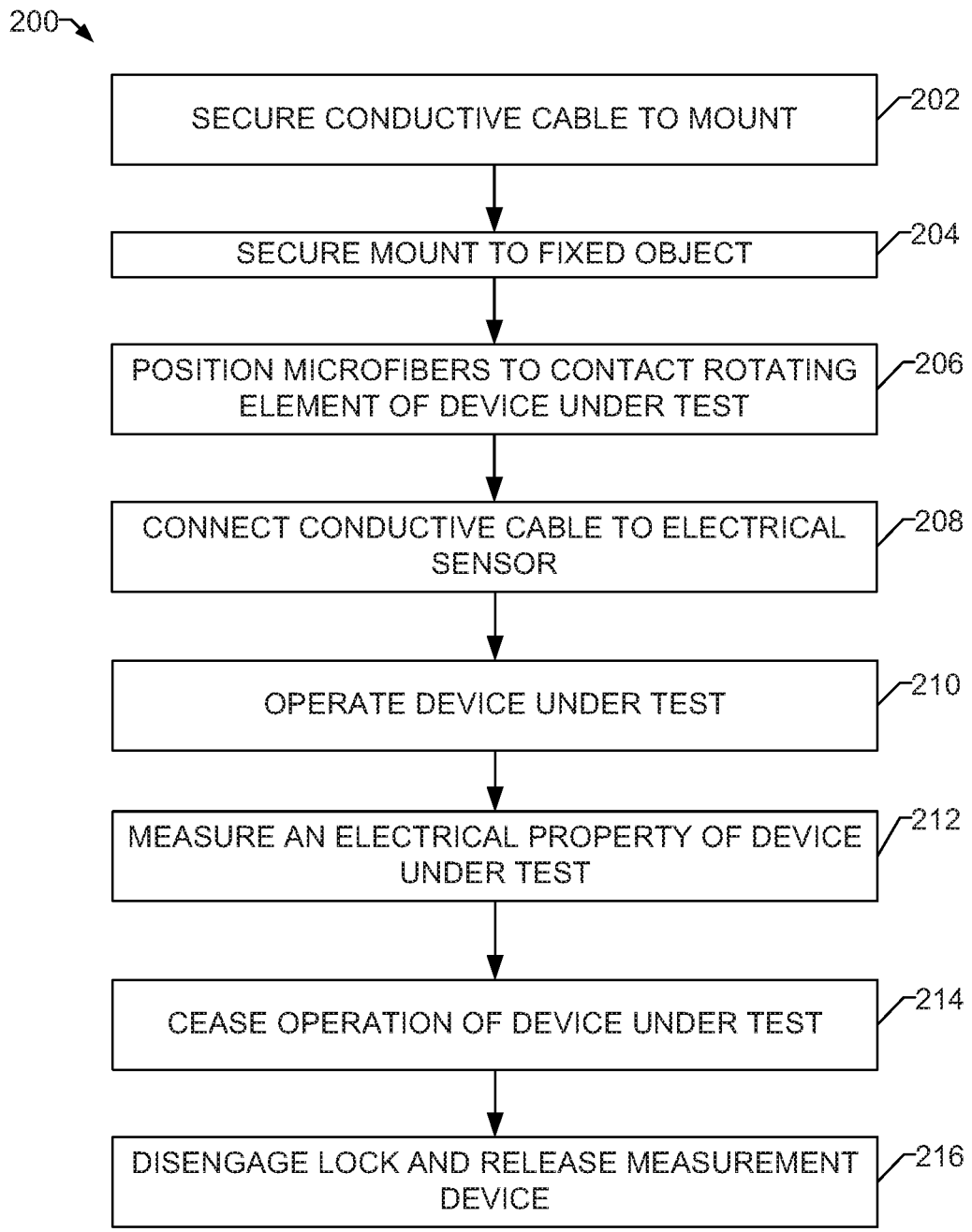
FIG. 5 shows a flowchart illustrating an example method which may be implemented to operate a measurement device.

FIG. 5 illustrates an example method 200 of using the measurement device 100 of FIGS. 1-4 to measure an electrical property of a motor, such as motor 302. Referring to FIG. 5, at block 202, the conductive cable 110 of the measurement device 100 is secured to a mount. At block 204, the mount is secured to a fixed object in a fixed position. For example, the mount can be secured by the lock 103 to a structural member of the facility where the motor 302 is being tested, or to a fixed piece of machinery. The lock 103 can be, for example, an electromagnet attracted to a ferromagnetic surface, a clamp, or a support plate bolted to a suitable surface.

At block 206, the conductive cable 110 is positioned such that the conductive filaments 118 are in contact with a shaft 304 of the motor 302. For example, adjusting the vertical support 104 and the position of the conductive cable 110 within the housing 108 by use of the several knobs 106 positions the conductive filaments 118 to maintain electrical contact with the shaft 304.

At block 208, the conductive cable 110 is connected to an electrical sensor (e.g., voltmeter 306 and/or ammeter 308). At block 210, the motor 302 is operated such that the shaft 304 rotates. In the present example, the conductive filaments 118 are positioned to maintain contact with the rotating shaft 304. At block 212, the electrical sensor (e.g., voltmeter 306 and/or ammeter 308) is employed to measure an electrical property (e.g., voltage and/or current) of the motor 302.

At block 214, operation of the motor 302 ceases, causing the shaft 304 to stop rotating. At block 216, the lock can be disengaged to release the measurement device 100. For example, the electromagnetic lock 103 can be switched off and the cable mount and device 100 can be removed.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, block and/or components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. An electrical measurement device comprising:
   a conductive cable comprising a plurality of conductive filaments on a first end and an electrical connector on a second end, the plurality of conductive filaments held in contact with a rotating element of a device under test during a measurement operation via a cable mount; and a coupling to secure the plurality of conductive filaments to the cable, the coupling comprising a conductive coupling in contact with each of the plurality of conductive filaments and the conductive cable.

2. The electrical measurement device of claim 1, wherein the cable mount comprises a base having a lock to secure the cable mount to a fixed structure during the measurement operation.

3. The electrical measurement device of claim 2, wherein the lock comprises at least one of an electromagnet, a clamp and a bolted support plate.

4. The electrical measurement device of claim 1, wherein the plurality of conductive filaments extends from the first end by a predetermined length to form a brush.

5. The electrical measurement device of claim 4, wherein at least one filament of the plurality of conductive filaments maintains electrical contact with the rotating element of the device under test when the device under test is in motion.

6. The electrical measurement device of claim 1, wherein the device under test comprises a motor, the rotating element comprising a shaft configured to rotate during operation of the motor.

7. The electrical measurement device of claim 1, wherein the plurality of conductive filaments is configured to maintain electrical contact with the rotating element as the rotating element rotates and the cable mount holds the conductive cable in a stationary position.

8. The electrical measurement device of claim 1, wherein the coupling and the conductive cable are encased in one or more electrically insulating layers.

9. The electrical measurement device of claim 1, wherein the electrical connector is a probe configured to connect with an electrical sensor to measure an electrical property of the device under test during a measurement operation.

10. The electrical measurement device of claim 9, wherein the electrical sensor comprises at least one of a voltmeter and an ammeter.

11. An electrical measurement system comprising:
a first electrical measurement device comprising a first conductive cable having a first plurality of conductive filaments on a first end and a first electrical connector on a second end, the first plurality of conductive filaments being held in contact with a first portion of a rotating element of a device under test during a measurement operation via a first cable mount; and
a second electrical measurement device comprising a second conductive cable having a second plurality of conductive filaments on a first end and a second electrical connector on a second end, the second plurality of conductive filaments being held in contact with a second portion of the rotating element of the device under test during a measurement operation via a second cable mount.

12. The electrical measurement system of claim 11, wherein the first cable mount comprises:
a first base; and
a first adjustable support attached to the first base and the first conductive cable; and
wherein the second cable mount comprises:
a second base; and
a second adjustable support attached to the second base and the second conductive cable.

13. The electrical measurement system of claim 11, further comprising an electrical sensor in electrical contact with at least one of the first and second electrical connectors to measure an electrical property of the device under test during a measurement operation.

14. The electrical measurement system of claim 11, wherein the first electrical connector is in contact with the second electrical connector via a conductive element to create a closed circuit.

15. The electrical measurement system of claim 11, wherein each of the first and second base comprises a lock to secure each respective cable mount to one or more fixed structures during the measurement operation, wherein each lock comprises at least one of an electromagnet, a clamp, and a bolted support plate.

16. The electrical measurement system of claim 11, wherein the device under test is an electric motor and the rotating element is a rotatable shaft.

17. An electrical measurement system comprising:
a conductive cable comprising a plurality of conductive filaments on a first end and an electrical connector on a second end, the plurality of conductive filaments held in contact with a rotating element of a device under test during a measurement operation via a cable mount;
a coupling to secure the plurality of conductive filaments to the cable, the coupling comprising a conductive coupling in contact with each of the plurality of conductive filaments and the conductive cable; and
an adjustable support attached to the conductive cable, the conductive cable forming a portion of a circuit through the plurality of conductive filaments that contact the rotating element of the device under test and the electrical connector in contact with an output.

18. The electrical measurement system of claim 17, wherein the adjustable support is configured to position the device such that the plurality of conductive filaments maintain electrical contact with the device under test.

19. The electrical measurement system of claim 18, wherein the device under test comprises a motor having a shaft, the adjustable support configured to position the device such that the plurality of conductive filaments maintain electrical contact with the motor shaft while the shaft rotates.

20. The electrical measurement system of claim 17, wherein the cable mount further comprises an electromagnetic lock to secure the cable mount to a fixed ferromagnetic surface in a fixed position during a measurement operation.

* * * * *